(12) United States Patent
Ponticelli et al.

(10) Patent No.: US 12,025,490 B2
(45) Date of Patent: Jul. 2, 2024

(54) SENSOR ARRANGEMENT

(71) Applicant: Vexcel Imaging GmbH, Graz (AT)

(72) Inventors: Martin Ponticelli, Graz (AT); Michael Gruber, Graz (AT); Zanin Cosic, Graz (AT)

(73) Assignee: VEXCEL IMAGING GMBH, Graz (AT)

( * ) Notice: Subject to any disclaimer, the term of this patent is extended or adjusted under 35 U.S.C. 154(b) by 177 days.

(21) Appl. No.: 17/754,419

(22) PCT Filed: Oct. 5, 2020

(86) PCT No.: PCT/EP2020/077862
§ 371 (c)(1),
(2) Date: Mar. 31, 2022

(87) PCT Pub. No.: WO2021/069382
PCT Pub. Date: Apr. 15, 2021

(65) Prior Publication Data
US 2022/0412795 A1    Dec. 29, 2022

(30) Foreign Application Priority Data
Oct. 7, 2019 (AT) .............................. A50846/2019

(51) Int. Cl.
*H04N 5/335*       (2011.01)
*B33Y 80/00*       (2015.01)
(Continued)

(52) U.S. Cl.
CPC ............ *G01J 1/0271* (2013.01); *B33Y 80/00* (2014.12); *H01L 27/14618* (2013.01); *H01L 27/14683* (2013.01); *H04N 23/54* (2023.01)

(58) Field of Classification Search
CPC ..................................................... H04N 23/54
See application file for complete search history.

(56) References Cited

U.S. PATENT DOCUMENTS 8,319,303 B2    1/2012   Yang et al.
8,308,379 B2 *  11/2012  Gooi ...................... H04N 23/57
                                                    396/529
(Continued)

FOREIGN PATENT DOCUMENTS

CN          1551619 A       12/2004
CN          102130138 A     7/2011
(Continued)

OTHER PUBLICATIONS

Meyer, Arne F., et al; "A Head-Mounted Camera System Integrates Detailed Behavioral Monitoring with Multichannel Electrophysiology in Freely Moving Mice"; Neuron, Neuroresource, vol. 100, Issue 1; Cell Press US, Elsevier Inc.; Oct. 10, 2018; 24 Pages.
(Continued)

*Primary Examiner* — Gary C Vieaux
(74) *Attorney, Agent, or Firm* — Husch Blackwell LLP

(57) ABSTRACT

A sensor arrangement including at least one electro-optical sensor which is secured to a receiving structure of a sensor holder. The electro-optical sensor includes a sensor housing with an optically active sensor layer that is arranged thereon. The optically active sensor layer forms a light-sensitive plane. The sensor holder includes a non-adjustable receiving structure which compensates for a previously determined deviation in shape of the electro-optical sensor from a desired shape.

15 Claims, 3 Drawing Sheets

(51) Int. Cl.
    *G01J 1/02*      (2006.01)
    *H01L 27/146*      (2006.01)
    *H04N 23/54*      (2023.01)

(56) References Cited

U.S. PATENT DOCUMENTS

| | | | |
|---|---|---|---|
| 9,225,881 B2* | 12/2015 | Hjelmstrom | H04N 23/45 |
| 10,415,955 B2 | 9/2019 | Haverkamp | |
| 10,466,097 B2 | 11/2019 | Gambart | |
| 2010/0123072 A1 | 5/2010 | Sprafke | |
| 2019/0335072 A1 | 10/2019 | Brückner et al. | |

FOREIGN PATENT DOCUMENTS

| | | |
|---|---|---|
| CN | 106716486 A | 5/2017 |
| CN | 108225190 A | 6/2018 |
| CN | 108231914 A | 6/2018 |
| DE | 102012103980 A1 | 11/2013 |
| DE | 102014212104 A1 | 12/2015 |
| EP | 1475960 A2 | 11/2004 |
| EP | 2485474 A1 | 8/2012 |
| EP | 1384046 B1 | 10/2018 |
| JP | 2005316461 A | 11/2005 |
| JP | 2006344838 A | 12/2006 |
| JP | 2009141791 A | 6/2009 |
| JP | 2010118892 A | 5/2010 |
| JP | 2013174784 A | 9/2013 |
| JP | 2013212571 A | 10/2013 |
| JP | 2013254914 A | 12/2013 |
| JP | 2015224946 A | 12/2015 |
| JP | 2018179984 A | 11/2018 |

OTHER PUBLICATIONS

Austrian Search Report; Application No. A50846/2019; Completed: Jul. 23, 2020; dated Jul. 28, 2020; 1 Page.
International Search Report and Written Opinion of the International Searching Authority; Application No. PCT/EP2020/077862; Completed: Dec. 7, 2020; dated Dec. 16, 2020; 17 Pages.
Chinese Office Action dated Nov. 25, 2023 for Chinese Patent Application No. 202080069032.0.
Machine Translation for JP2005316461A.
Machine Translation for JP2013254914A.
Machine Translation for CN1551619A.
Machine Translation for CN106716486A.

* cited by examiner

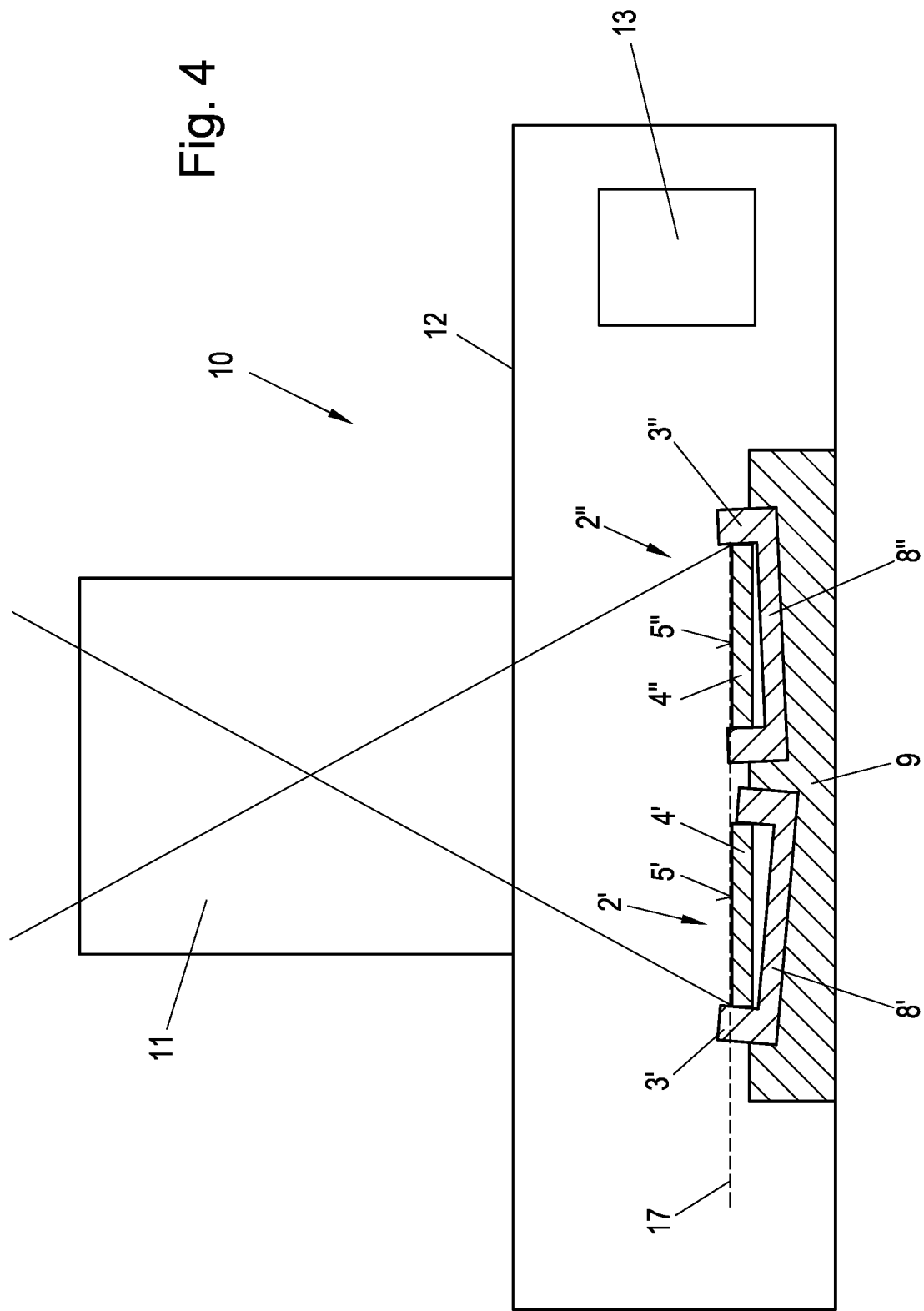

SENSOR ARRANGEMENT

TECHNICAL FIELD

The present disclosure relates to a method for producing a sensor arrangement and a sensor arrangement comprising at least one electro-optical sensor which is secured to a receiving structure of a sensor holder, the electro-optical sensor comprising a sensor housing with an optically active sensor layer arranged thereon, and the optically active sensor layer forming a light-sensitive plane.

BACKGROUND

Electro-optical sensor products are developed by the industry for various uses, in particular in the field of digital photography and imaging measurement technology, and are available worldwide. A stable and geometrically precise connection between the lens and the electro-optical sensor is essential for use in a photographic recording device—i.e., a digital camera. Optical focusing is only possible if the light-sensitive plane of the optically active sensor layer is introduced into the image plane of the camera lens. The positional accuracy of this positioning is demanding and requires a geometric accuracy of, in general, at least below 100 μm for high-quality devices; even higher accuracies are required for special uses such as digital large-format photography, in particular in the field of mobile mapping, photogrammetry, geomatics or similar uses, in which only a few micrometers, for example less than 10 μm or even less than 3 μm, may be desired and/or required as the maximum permissible position tolerances (in each case in position, height and tilt).

Electro-optical sensors usually have a sensor housing made of a ceramic material, on which the optically active sensor layer is arranged, which forms the light-sensitive plane. The electro-optical sensor also comprises electrical contacts, usually gold-plated pins, which can be connected to the electronic control system of the corresponding measurement or camera system via soldering points, for example on the side opposite the active sensor layer.

The position of the electro-optical sensor, more precisely, the light-sensitive plane of same, in relation to the sensor housing is initially only known with insufficient accuracy. The specifications provided by the manufacturers often have far greater tolerances than are required for high-quality positioning in the camera body. In the case of commercially available CMOS or CCD sensor products, tolerances of approximately 300 μm in position and 150 μm in height and for tilting, for example, can usually be guaranteed by most manufacturers. Tolerance deviations of the order of 10 μm or less, as required for special uses, are not achieved even with high-quality products.

This is due to the fact that the geometric shape of the ceramic sensor housing is only known with insufficient precision, and the manufacturing tolerances are also relatively large, and that the pixel elements of the optically active sensor layer are usually secured to the sensor housing by means of adhesive connections, which can lead to additional tolerance deviations.

For the production of particularly accurate measuring or camera systems, it is therefore necessary to determine the position of the light-sensitive plane of the electro-optical sensor in the mechanical housing thereof in all three coordinate directions. For this purpose, the electro-optical sensor is usually arranged in an adjustable receiving structure of a sensor holder, which has a defined position relative to the lens. The light-sensitive plane is then usually adjusted by means of adjusting screws after the electro-optical sensor has been installed in the measuring system or the camera. To facilitate the adjustment, the manufacturer usually specifies fitting positions which allow the position of the sensor housing to be defined. For this purpose, the sensor manufacturer describes fitting positions on the ceramic housing which can now be used as a basis for describing the position of the sensor in the ceramic housing (e.g., three positions on the edge of the ceramic housing for the position in X and Y, and three positions on the lower face of the ceramic housing for the vertical alignment including tilting).

The adjustment process usually has to be carried out manually, with the verification of the correct position being determined, for example, by means of test recordings. For the adjustment, an image of a test template can be generated using the sensor to be adjusted on an adjustment table, for example, and compared with a desired image. The mechanical adjustment is then carried out using adjusting screws or similar mechanical actuators and a micro-movement of the sensor in the frame thereof, which can be monitored via the fitting positions. A software-supported evaluation of the test images and a computer-aided movement or positioning of the sensor can support this iterative, complex and demanding process to a certain extent, but technically highly qualified personnel are still required for the adjustment. The problem intensifies when a plurality of electro-optical sensors are to be aligned with one another on a single sensor holder (with a plurality of receiving structures for each electro-optical sensor) and are to be brought into the corresponding desired position.

SUMMARY

One object of the present disclosure is to provide devices and methods which reduce or prevent the amount of work involved in the adjustment of electro-optical sensors, and by means of which higher accuracies (i.e., lower tolerances) can be achieved.

In one embodiment, these and other aims are achieved by a method of the type mentioned at the outset, which comprises the following steps: providing an electro-optical sensor having a sensor housing and an optically active sensor layer arranged thereon, which forms a light-sensitive plane, arranging the electro-optical sensor in a locationally defined manner in a measuring recess of a measuring holder, determining, by means of a measuring unit, a position transformation of the actual position of the light-sensitive plane relative to the measuring holder with respect to a desired position of the light-sensitive plane defined in relation to the measuring holder, producing a sensor holder having a non-adjustable receiving structure which compensates for the deviation in shape of the electro-optical sensor from a desired shape, which deviation is described by the position transformation, securing the electro-optical sensor in the receiving structure of the sensor holder. The method makes it possible to use the electro-optical sensor to obtain precise information about the required adjustment actions even before installation in a sensor arrangement and before the electrical start-up of the sensor to be adjusted, and to take this information into account when producing the sensor holder. The measuring holder and the sensor holder can in this case be of identical design, for example. As a result, a subsequent adjustment after the installation of the sensor arrangement in the camera is no longer necessary.

In the context of the present disclosure, "positionally defined arrangement" refers to an arrangement in which the position of at least one positioning feature of the electro-optical sensor in relation to the measuring holder is clearly defined. The positioning feature may be, for example, a corner edge of the sensor housing which is arranged at a specific point and in a specific alignment on the measuring holder. Advantageously, the positioning feature can correspond to the positioning of the sensor in the receiving structure of the sensor holder, for example by the measuring recess of the measuring holder substantially corresponding to the receiving structure of the sensor holder. For example, the fitting positions provided by the manufacturer of the electro-optical sensor and/or other features of the electro-optical sensor can be used as positioning features.

In the context of the present disclosure, a "position transformation" refers to a defined calculation process, by means of which features of the actual position (e.g., points, areas and/or shapes) can be converted into the corresponding features of the desired position, or vice versa. The position transformation can be described, for example, in the form of a transformation matrix.

The method can advantageously further comprise the following steps: measuring, by means of the measuring unit, a deviation of at least one measurement point of the light-sensitive plane and/or of the sensor housing from a desired position of this measurement point that is defined in relation to the measuring holder, determining the actual position of the light-sensitive plane from at least one measured deviation, determining the position transformation between the measured position of the light-sensitive plane and the desired position of this light-sensitive plane. Even the measurement of a single measurement point can allow a position transformation to be determined (even if the transformation is incomplete); for example, only the position of a known feature on the light-sensitive plane could be measured and the deviation thereof from the desired position could be determined. The position transformation can then correspond, for example, to a displacement of the light-sensitive plane according to the measured deviation. However, further measurement points are advantageously determined in order to be able to map a plurality of aspects of the position transformation (in particular translations, rotations and, if necessary, scalings in all axis directions).

The measurement can be carried out using any direct or indirect, preferably non-contact, measuring devices suitable for this purpose. Examples of suitable measurement devices include mechanical measurement devices which determine a shape using tactile scanning, such as micrometers or calipers, optical measuring systems which include image, line, and/or pixel sensors, such as 1 D, 2D, and 3D laser displacement sensors, measuring devices having imaging sensors, the determination being carried out by image analysis, and measuring devices which use the above measuring methods in combination. A preferred example of a measuring device are opto-mechanical measuring devices, in which the electro-optical sensor is positioned mechanically, and the measurement is carried out optically. The opto-mechanical measurement of the sensor in a stable frame with defined fitting positions can be carried out, for example, using known industrial optical 3D measuring systems. An example of a measuring device which can be used is the device manufactured under the name "Vertex 251 UC" by the American company Micro Vu, Windsor, CA.

In a further advantageous embodiment, the method can further comprise the following steps: arranging at least one measuring camera of the measuring unit in at least one spatial position relative to the measuring holder, creating at least one measurement recording using the at least one measuring camera, the measurement recording comprising at least part of the light-sensitive plane and/or of the sensor housing and optionally of the measuring holder, determining coordinates of the at least one measurement point and, if necessary, coordinates of the desired position of this measurement point from the at least one measurement recording, determining the position transformation between the measured position of the light-sensitive plane and the desired position of this light-sensitive plane from the coordinates. Such an optical measurement and an evaluation of the measurement recording is relatively easy to achieve, allows very accurate results, and can also be carried out in an automated manner for large batches.

At least one spatial position relative to the measuring holder can advantageously be determined on the basis of the corresponding measurement recording. This can reduce the complexity of positioning the measuring holder and measuring unit. For the determination of the spatial position, for example, the measuring holder can have corresponding markings, on the basis of which the relevant relative position between the measuring holder and the spatial position of the measuring unit for each individual measurement recording, and/or the determination can be carried out on the basis of known (structural) features of the measuring holder.

The sensor holder having the receiving structure can advantageously be produced using a 3D printing process. High-precision 3D printing processes allow the production of sensor holders with tight tolerances, it being possible for the receiving structure to be post-processed, if necessary, in order to increase dimensional accuracy.

According to a further advantageous embodiment, the sensor holder having the receiving structure can be produced using a machining process. Manufacturing tolerances in the range of only 5 µm can be achieved using high-precision machining processes. Metal alloys which behave in a mechanically similar way to the material of the sensor housing can be used as the material of the sensor holder, for example.

In an advantageous embodiment, a plurality of electro-optical sensors can be secure in a plurality of receiving structures of a single sensor holder. This makes it possible to produce large-format cameras in which a plurality of electro-optical sensors is combined to form a large-area "mosaic". Examples of such cameras include the camera systems disclosed in EP 1 384 046 B1.

In a further aspect, the present disclosure relates to a sensor arrangement of the type mentioned at the outset, the sensor holder having a non-adjustable receiving structure which compensates for a previously determined deviation in shape of the electro-optical sensor from a desired shape. Such a sensor arrangement can not only be produced inexpensively, since adjustment means such as adjusting screws can be dispensed with, but it can also be installed inexpensively in a camera system or measuring system, since a complex adjustment is not required. Nevertheless, tolerances can be achieved which were previously only possible with complex adjustments. This supports the calibration and makes better approximations and an optimally centered image position possible. In the case of camera heads having a plurality of sensors, the image sharpness in the entire image region is significantly improved across all sensors. A tilting of the sensor is also prevented, which in turn improves focus over the entire image.

In the context of the present disclosure, a "non-adjustable receiving structure" refers to a receiving structure which allows the electro-optical sensor to be arranged in a defined position. An adjustment of the position of the electro-optical sensor in the receiving structure is neither necessary nor provided.

In the context of the present disclosure, a "desired shape" of the electro-optical sensor refers to a theoretical shape which would have to be set on the basis of the dimensional specifications without tolerance deviations.

In the context of the present disclosure, a "deviation in shape from a desired shape" refers to the sum of all determined deviations of actual positions with respect to desired positions. The deviation in shape can in particular be defined or described by the position transformation described above.

The electro-optical sensor can advantageously be accommodated in the receiving structure in a form-fitting manner, which makes a particularly simple assembly possible. Such a form-fitting reception, which can be supplemented, for example, by clamping mechanisms, locking screws or the like, allows very small tolerances to be maintained.

In a further advantageous embodiment, the sensor holder can comprise a material which is substantially identical to the material of the sensor housing, at least with regard to the coefficient of thermal expansion. In this context, "substantially identical" means that the effects of different material properties are negligible with regard to tolerances. Negative effects of temperature changes can thus be prevented. In particular, a "joint" deformation of the components can be achieved in the case of temperature changes, such that the temperature-related tolerance deviation is minimal. The extent of such tolerance deviations can also be calculated relatively easily on the basis of the temperature and, if necessary, automatically compensated. Examples of materials include ceramic materials, metal alloys, plastics materials, and combinations of these materials, each selected in accordance with the properties of the sensor housing.

The sensor holder and/or the sensor housing can advantageously be produced using a ceramic material, in particular a ceramic material produced using a 3D printing process. During production, the previously determined transformation can be used to calculate the required compensating shape of the receiving structure. This can take place on the basis of algorithms, which also makes it possible to serially produce sensor holders which are specially tailor-made for a specific, previously measured electro-optical sensor. Very small and manageable temperature-related tolerance deviations can also be achieved using the ceramic material.

In a further advantageous embodiment, the sensor holder can have a plurality of receiving structures which each have an electro-optical sensor arranged thereon. This allows large-format cameras to be produced which have a plurality of optimally aligned electro-optical sensors designed in accordance with the teachings of this disclosure.

In a further aspect, the present disclosure relates to a camera having at least one optical unit, at least one camera housing, at least one electronic control system and at least one sensor arrangement.

BRIEF DESCRIPTION OF THE DRAWINGS

The present disclosure is described in greater detail below with reference to FIGS. 1 to 4, which show exemplary, schematic and non-limiting advantageous embodiments of the present disclosure. In the drawings:

FIG. 4 is a schematic cross-sectional view of a camera.

DETAILED DESCRIPTION

Figure 1:
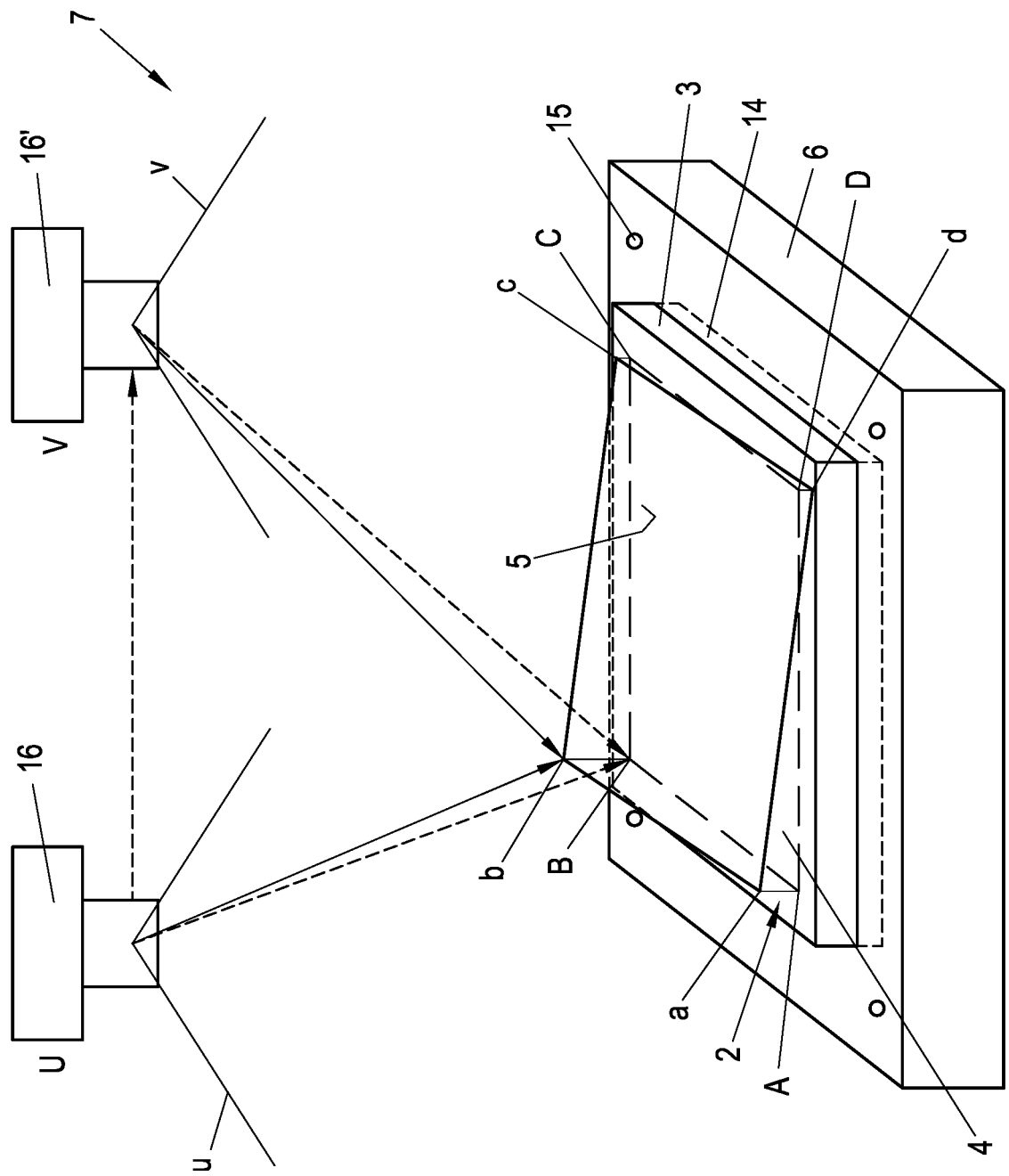
FIG. 1 is a schematic view of a measuring holder having an electro-optical sensor arranged thereon in the image region of an optical measuring unit.

FIG. 1 shows a measuring holder 6 which has a measuring recess 14 into which an electro-optical sensor 2 is fitted. The electro-optical sensor 2 has a sensor housing 3 on which an optically active sensor layer 4 is arranged. The optically active sensor layer 4 has a light-sensitive plane 5 which, depending on the design, can either be the outer surface of the active sensor layer 4, or a plane which is slightly offset from this outer surface (this can be the case, for example, when using microlenses).

In the context of the present disclosure, the "light-sensitive plane 5" refers to the plane of the active sensor layer 4 with which the image plane of a camera lens must be aligned in order to ensure optical focusing of the images recorded using the camera lens.

Due to excessively large tolerances (which are designed for a conventional use of the electro-optical sensors 2, for example in digital cameras suitable for the mass market, and are sufficient for this), both the sensor housing 3 and the electro-optical sensor 2 can have significant deviations from their desired shape in relation to the measuring holder, the tolerance deviations in the views from the figures being greatly exaggerated for reasons of visibility. Normally, even a tolerance deviation in the range of less than 10 μm can cause a relevant deterioration in the required image quality for particularly sensitive photographic uses. The tolerances generally guaranteed by manufacturers of electro-optical sensors 2 are considerably higher.

In general, each electro-optical sensor 2 has an actual shape which differs (within the tolerances) from the desired shape thereof (i.e., the shape or dimensions according to the information provided by the manufacturer). With regard to individual elements of the electro-optical sensor, such as the light-sensitive plane 5, this results in an actual position, which is referred to herein as the actual position, and a theoretical position, which would have to be set without tolerance deviations and which is referred to herein as the desired position.

The difference between the actual position and the desired position can be described, for example, on the basis of "displacements" of measurement points a, b, c, d from the desired position A, B, C, D defined for said points. If the light-sensitive plane 5 is substantially planar, the entire displacement of all measurement points a, b, c, d lying in the light-sensitive plane 5 from the relevant desired position A, B, C, D can be represented by a position transformation, it being possible for the position transformation to be easily described and further processed in the form of a corresponding transformation matrix, for example.

In the view in FIG. 1, for example, the four corner points of the optically active sensor layer 4 are defined as measurement points a, b, c, d. The corresponding points are denoted by reference signs A, B, C and D in the desired position of the sensor layer 4 shown in dashed lines. In the case shown, three measurement points a, b and c are each "above" the corresponding desired positions A, B, C, and one measurement point d is displaced "downward" with respect to the corresponding desired position D. If necessary, the measurement points can additionally be displaced in any lateral direction. The terms "up" and "down" relate to the view in FIG. 1 and are not to be interpreted as restrictive. The deviation of the measurement points a, b, c, d from their corresponding desired positions A, B, C, D can, for example, be due to an irregular adhesion of the optically active sensor layer 4 to the sensor housing 3, or the sensor housing 3 can also have tolerance deviations which have contributed to a deviation of the measurement points a, b, c, d from their desired position.

The position transformation of the electro-optical sensor can be determined using an optical measuring unit 7.

In the case shown in FIG. 1, a measuring unit 7 is used which has at least one measuring camera 16, 16', each measuring camera 16, 16' taking one or more recordings u, v of the unit consisting of the measuring holder 6 and electro-optical sensor 2 from one or more spatial positions U, V. In FIG. 1, the measuring camera at the spatial position marked "U" is provided with reference sign 16, and the measuring camera at the spatial position marked "V" is denoted by reference sign 16', it being possible for this to also be a single measuring camera 16 which is moved from one spatial position to the other between the individual measurement recordings.

The relevant spatial position U, V of the measuring camera 16, 16' relative to the measuring holder 6 can either be known on the basis of the design of the measuring unit 7, or it can be determined for each recording u, v on the basis of an image evaluation. For this purpose, the measuring holder 6 can have defined measuring structures 15, for example. On the basis of an evaluation of the measurement recordings u, v, the position transformation between the desired position and the actual position (or vice versa) can be determined and defined in any coordinate system.

If necessary, further visible structures of the electro-optical sensor 2 can be recorded geometrically. The manufacturer specification of the sensor surface is specified, for example, by the number and size of the individual pixels with a high level of geometric accuracy and can therefore be used as the basis for a Cartesian coordinate system. The optically visible structures on the sensor surface can then be used as markings or measurement points in this coordinate system.

If necessary, the position of the sensor housing 3 can also be determined on the basis of additional measurement points (not shown) or known structures, such that the position transformation between the sensor housing 3 and the measuring holder 6 (or between the sensor housing 3 and the optically active sensor layer 4) can also be determined. For this purpose, the fitting positions, which are specified by the manufacturer and allow the position of the sensor housing 3 to be clearly defined, can also be used. If necessary, visible electrical contacts on the sensor housing 3 can be used as measurement points.

It is already possible to determine a position transformation with regard to position, orientation and scale on the basis of a single measurement recording. On the basis of a plurality of measurement recordings from different spatial positions U, V, a completely three-dimensional position transformation can be calculated by blending a plurality of lines of sight. On the basis of a plurality of measurement recordings, the accuracy can be refined, for example, by means of image triangulation methods and a subsequent compensation calculation.

The measurement images can be evaluated, for example, using software tools which analyze the image content, identify the structures and measurement points to be measured, determine the position thereof in the image coordinate system, and calculate the corresponding transformation with respect to the desired position.

The measuring recess 14 of the measuring holder 6 can be designed as a fitted recess which matches the shape of the sensor housing 3, clamping or fixing elements optionally being able to ensure the precise positioning of the sensor housing 3 in the measuring recess 14 (for example with regard to a corner of the measuring recess 14). The measuring recess 14 is preferably substantially identical to a receiving structure 8 of a sensor holder 9, into which the electro-optical sensor 2 is to be inserted and which is described further below.

Figure 2:
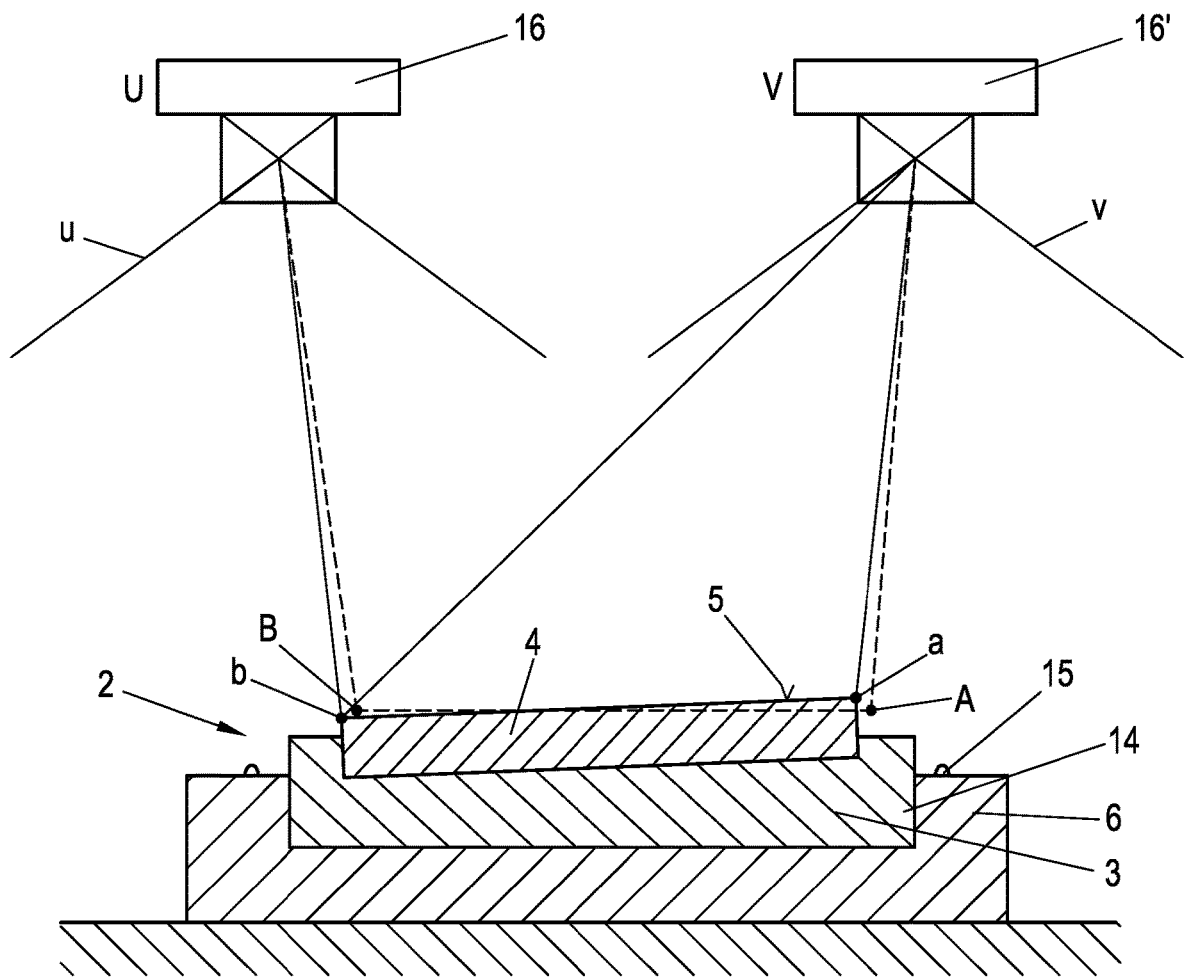
FIG. 2 shows a measuring holder having an electro-optical sensor arranged thereon in a schematic cross-sectional view.
Figure 3:
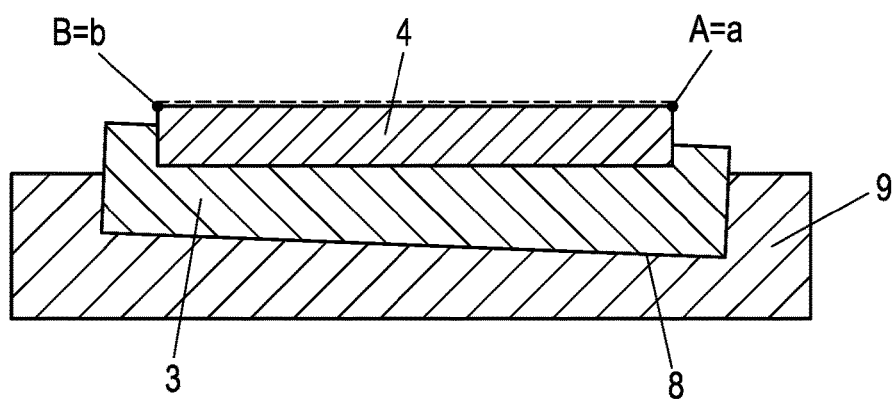
FIG. 3 is a schematic cross-sectional view of an electro-optical sensor inserted into a receiving structure of a sensor holder.

FIG. 2 shows a structure in an even more simplified sectional view, which structure is substantially equivalent to the structure described above with reference to FIG. 1, the deviation of the lines of sight from the measuring camera 16, 16' to the measurement points a, b (in continuous lines) and to the desired positions A, B thereof (in dashed lines) being shown. The course of the lines of sight (which can be determined from the measurement recordings) allows the position of the measurement points to be determined by triangulation, on the basis of which a position transformation can be determined.

The measuring unit described above, and the method carried out therewith to determine the position transformation are merely exemplary. It is within the ability of an average person skilled in the art who has knowledge of the teachings disclosed herein to also carry out the determination of the position transformation by means of different measuring units.

By means of the determined position transformation, it is possible to design the sensor holder 9, in which the electro-optical sensor 2 is to be installed, in such a way that the shape thereof (or the shape of the receiving structure 8 of the sensor holder 9) compensates for the deviation in shape between the actual shape and the desired shape of the electro-optical sensor 2 that is described by the position transformation. The electro-optical sensor 2, which is inserted into this tailor-made sensor holder, now has a light-sensitive plane 5, the actual position of which has a significantly smaller deviation with respect to the desired position than was the case in relation to the measuring holder 6, and the arrangement of which therefore also makes significantly lower tolerances possible. In addition, it is no longer necessary to adjust the sensor holder 9 in a complex manner by means of adjusting screws or the like after the electro-optical sensor 2 has been secured. The sensor holder 9 can therefore be designed in a particularly simple manner, for example as a fitted shape, which can optionally have tensioning, clamping and/or fixing means for securing the electro-optical sensor 2.

Since complex adjustment systems are therefore not required, the sensor holder 9 can be produced, for example, in a 3D printing process, for example as ceramic 3D printing, but other materials can also be used. If necessary, the sensor holder 9 produced by means of a 3D printing process can be post-processed to improve the tolerances, for example by means of a machining process. In other embodiments, the sensor holder 9 can also be machined from a blank by means of conventional machining processes, it being necessary to ensure that the required tolerances can be achieved by the selected process.

An individual sensor holder 9 can therefore be manufactured for each sensor. The individual electro-optical sensor can then be stably secured in this tailor-made sensor holder 9 and thus installed in the camera to be manufactured without additional adjustment work. After the electro-optical sensor 2 has been secured in the individual, tailor-made sensor holder 9, a control measurement can be carried out in order to verify the successful assembly and thus the geometrically correct mounting of the optically active sensor layer 4.

FIG. 4 is a schematic view of a camera 10 having a housing 12, an optical unit 11 and a control unit 13. A sensor holder 9 is arranged in the region of the image plane 17 of the optical unit 11, which sensor holder has two receiving structures 8' and 8" for an electro-optical sensor 2' and 2" in each case. The two receiving structures 8', 8" are each made to fit the two sensor housings 3', 3" arranged thereon in such a way that the light-sensitive planes 5', 5" of the optically active sensor layers 4', 4" are both very precisely brought into alignment with the image plane 17. Furthermore, the position of the optically active sensor layers 4', 4" and the distance between the edges thereof are set precisely with a low tolerance.

In a similar way, cameras can be produced which have a larger number of electro-optical sensors with a high level of image fidelity, such as are required for uses in the field of photogrammetry. If necessary, individual electro-optical sensors of such a mosaic-like arrangement can also be arranged so as to be slightly inclined and/or raised or lowered in a defined manner with respect to an image plane, for example in order to compensate for an image field curvature of a lens in the image edge region. Such defined inclinations and displacements can be produced in a simple and highly precise manner by means of the methods and devices described herein.

The schematic views shown in FIGS. 1 to 4 are each reduced to the most essential elements and greatly simplified. However, with knowledge of the teaching disclosed herein, the person skilled in the art is able to apply these to practical cases, in which case the shape and configuration of the elements can be significantly more complex with regard to the electro-optical sensor 2, the sensor holder 9 and/or the measuring holder 6. For example, the region of the sensor housing in which the electro-optical sensor is introduced is usually sealed and protected by a cover glass. The cover glass is known in terms of thickness and refractive index and can be taken into account accordingly.

The invention claimed is:

1. A method for producing a sensor arrangement, wherein the method comprises the following:
    providing an electro-optical sensor having a sensor housing and an optically active sensor layer arranged thereon, which forms a light-sensitive plane,
    arranging the electro-optical sensor in a positionally defined manner in a measuring recess of a measuring holder,
    determining, by a measuring unit, a position transformation of the actual position of the light-sensitive plane relative to the measuring holder with respect to a desired position of the light-sensitive plane defined in relation to the measuring holder,
    producing a sensor holder having a non-adjustable receiving structure which compensates for the deviation in shape of the electro-optical sensor from a desired shape, which deviation is described by the position transformation,
    securing the electro-optical sensor in the receiving structure of the sensor holder).

2. The method according to claim 1, wherein the determining the position transformation includes the following:
    measuring, by the measuring unit, a deviation of at least one measurement point of the light-sensitive plane and/or of the sensor housing from a desired position of this measurement point that is defined in relation to the measuring holder,
    determining the actual position of the light-sensitive plane from at least one measured deviation,
    determining the position transformation between the measured position of the light-sensitive plane and the desired position of this light-sensitive plane.

3. The method according to claim 1, wherein the determining the position transformation comprises the following:
    arranging at least one measuring camera of the measuring unit in at least one spatial position relative to the measuring holder,
    creating at least one measurement recording using the at least one measuring camera, the measurement recording including at least part of the light-sensitive planet and/or of the sensor housing,
    determining coordinates of the at least one measurement point and, if necessary, coordinates of the desired position of this measurement point from the at least one measurement recording,
    determining the position transformation between the measured position of the light-sensitive plane and the desired position of this light-sensitive plane from the coordinates.

4. The method according to claim 3, wherein the at least one spatial position relative to the measuring holder is determined on the basis of the corresponding measurement recording.

5. The method according to claim 1, wherein the sensor holder having the receiving structure is produced using a 3D printing process.

6. The method according to claim 1, wherein the sensor holder having the receiving structure is produced using a machining process.

7. The method according to claim 1, wherein a plurality of electro-optical sensors are secured in a plurality of receiving structures of a single sensor holder.

8. A sensor arrangement, comprising,
    at least one electro-optical sensor which is secured to a receiving structure of a sensor holder,
    the electro-optical sensor including a sensor housing having an optically active sensor layer, arranged thereon, and
    the optically active sensor layer forming a light-sensitive plane,
    wherein the sensor holder includes anon-adjustable receiving structure which compensates for a previously determined deviation in shape of the electro-optical sensor from a desired shape.

9. The sensor arrangement according to claim 8, wherein the sensor holder is produced using a 3D printing process.

10. The sensor arrangement according to claim 8, wherein the electro-optical sensor is received in the receiving structure in a form-fitting manner.

11. The sensor arrangement according to claim 8, wherein the sensor holder includes a material which is substantially identical to the material of the sensor housing at least with regard to the coefficient of thermal expansion.

12. The sensor arrangement according to claim 8, wherein the sensor holder and/or the sensor housing are produced using a ceramic material.

13. The sensor arrangement according to claim 9, wherein the sensor holder and/or the sensor housing are produced using a machining process.

14. The senor arrangement according to claim 8, wherein the sensor holder includes a plurality of receiving structures which each have an electro-optical sensor arranged thereon.

15. A camera comprising at least one optical unit, at least one camera housing, at least one electronic control system and at least one sensor arrangement according to claim 8.

* * * * *